United States Patent
Nurani et al.

(10) Patent No.: US 10,579,041 B2
(45) Date of Patent: Mar. 3, 2020

(54) SEMICONDUCTOR PROCESS CONTROL METHOD

(71) Applicant: Applied Materials, Inc., Santa Clara, CA (US)

(72) Inventors: Raman K. Nurani, Chennai (IN); Anantha R. Sethuraman, Palo Alto, CA (US); Koushik Ragavan, Chennai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 4 days.

(21) Appl. No.: 15/829,626

(22) Filed: Dec. 1, 2017

(65) Prior Publication Data

US 2019/0171181 A1   Jun. 6, 2019

(51) Int. Cl.
*G05B 19/406* (2006.01)
*H01L 21/67* (2006.01)
*H01L 21/66* (2006.01)
*G06N 20/00* (2019.01)

(52) U.S. Cl.
CPC .......... *G05B 19/406* (2013.01); *G06N 20/00* (2019.01); *H01L 21/67115* (2013.01); *H01L 21/67184* (2013.01); *H01L 21/67248* (2013.01); *H01L 21/67253* (2013.01); *H01L 21/67276* (2013.01); *H01L 22/12* (2013.01); *H01L 22/20* (2013.01); *G05B 2219/45031* (2013.01); *H01L 21/67167* (2013.01)

(58) Field of Classification Search
CPC ........ G05B 19/406; G05B 2219/45031; G06N 20/00; H01L 21/67248; H01L 21/67253; H01L 22/12; H01L 21/67167
See application file for complete search history.

(56) References Cited

U.S. PATENT DOCUMENTS

| | | | | |
|---|---|---|---|---|
| 7,720,559 | B1* | 5/2010 | Stewart | G05B 19/4187 700/101 |
| 8,560,109 | B1* | 10/2013 | Parr | G05B 15/00 345/420 |
| 2004/0254752 | A1* | 12/2004 | Wisniewski | H01L 22/20 702/84 |

(Continued)

OTHER PUBLICATIONS

U.S. Appl. No. 15/486,089, filed Apr. 12, 2017.
U.S. Appl. No. 62/514,543, filed Jun. 2, 2017.

*Primary Examiner* — Thomas C Lee
*Assistant Examiner* — Anzuman Sharmin
(74) *Attorney, Agent, or Firm* — Patterson + Sheridan LLP

(57) ABSTRACT

Implementations described herein generally relate method for detecting excursions in time-series traces received from sensors of manufacturing tools. A server extracts one or more time series traces and metrology data collected from one or more sensors associated with one or more manufacturing tools configured to produce a silicon substrate. The server identifies one or more candidate excursions of the one or more time series traces by comparing the one or more time series traces to one or more traces associated with a working reference sensor. The server verifies that a candidate excursion of the one or more candidate excursions is a true excursion based on correlating the one or more time series traces to the metrology data. The server instructs a manufacturing system to take corrective action to remove the selected true excursion.

20 Claims, 8 Drawing Sheets

(56) References Cited

U.S. PATENT DOCUMENTS

| | | | |
|---|---|---|---|
| 2007/0219736 A1* | 9/2007 | Okita | G03F 7/70525 702/81 |
| 2009/0228129 A1* | 9/2009 | Moyne | G05B 19/41865 700/102 |
| 2010/0164128 A1* | 7/2010 | Enns | B29C 35/0805 264/1.38 |
| 2017/0261971 A1* | 9/2017 | Schulze | G05B 23/0254 |

* cited by examiner

SEMICONDUCTOR PROCESS CONTROL METHOD

BACKGROUND

Field

Implementations described herein generally relate to analyzing time series traces to detect excursions in sensors employed in one or more semiconductor processing chambers.

Description of the Related Art

Manufacturing silicon substrates involves a series of operations, which may include a lithography operation. In the lithography operation, a mask pattern is imaged onto a substrate that is at least partially covered by a layer of radiation-sensitive material (resist). Prior to this imaging operation, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, is repeated for each new layer. Eventually, an array of devices will be present on the substrate (substrate). These devices are then separated from one another by a technique such as dicing or sawing, whence the individual devices can be mounted on a carrier, connected to pins, etc.

Usually a number of different processing operations may be performed in a single processing system or "tool" which includes a plurality of processing chambers. During processing, each chamber in which a procedure is carried out may include a plurality of sensors, with each sensor configured to monitor a predefined metric relating to substrate processing.

Further, these multiple silicon substrate processing operations occur over an interval of time. A process may include a transition from a first operation to a second operation. Time-series data is data collected over the interval of time, including the transition (e.g., the time-series transition). Typically, statistical methods (e.g., statistical process control (SPC)) are utilized to analyze sensor data for semiconductor manufacturing processes. However, SPC and other statistical methods of monitoring processes are not capable of monitoring time-series transitions to detect excursions (e.g., outliers in the time trace data). Outlier (excursion) detection in sensor trace data aids in assessing the overall health of the chamber in which a substrate processing procedure is carried forth. Outlier detection needs to increasingly become more sensitive to detect anomalies in a more refined range of sensor data, especially when batches of substrates increase to the thousands.

Statistical methods cannot detect short-time signal perturbations in data received from sensors over time. Statistical methods also provide false positives (e.g., that an entire signal does not match a target signal because a minimal portion of the signal is outside of a guard band) and do not allow for adjustment of the sensitivity of outlier detection.

Therefore, there is a continual need for an improved method of detecting outliers/excursions in sensor data retrieved during semiconductor processing.

SUMMARY

A method for detecting excursions in time-series traces received from sensors of manufacturing tools is disclosed. In one implementation, a server extracts one or more time series traces and metrology data collected from one or more sensors associated with one or more manufacturing tools configured to produce a silicon substrate. The server identifies one or more candidate excursions of the one or more time series traces by comparing the one or more time series traces to one or more traces associated with a working reference sensor. The server verifies that a candidate excursion of the one or more candidate excursions is a true excursion based on correlating the one or more time series traces to the metrology data. The server instructs a manufacturing system to take corrective action to remove the selected true excursion.

In another implementation, a computer system is provided, which comprises a memory and a processor configured to perform a method for detecting excursions in time-series traces received from sensors of manufacturing tools, the method includes extracting one or more time series traces and metrology data collected from one or more sensors associated with one or more manufacturing tools configured to produce a silicon substrate. The method further includes identifying one or more candidate excursions of the one or more time series traces by comparing the one or more time series traces to one or more traces associated with a working reference sensor. The method further includes verifying that a candidate excursion of the one or more candidate excursions is a true excursion based on correlating the one or more time series traces to the metrology data. The method further includes instructing a manufacturing system to take corrective action to remove the selected true excursion.

In yet another implementation, a non-transitory computer-readable medium is provided, which comprises instructions to perform a method for detecting excursions in time-series traces received from sensors of manufacturing to. In one embodiment, the method includes extracting one or more time series traces and metrology data collected from one or more sensors associated with one or more manufacturing tools configured to produce a silicon substrate. The method further includes identifying one or more candidate excursions of the one or more time series traces by comparing the one or more time series traces to one or more traces associated with a working reference sensor. The method further includes verifying that a candidate excursion of the one or more candidate excursions is a true excursion based on correlating the one or more time series traces to the metrology data. The method further includes instructing a manufacturing system to take corrective action to remove the selected true excursion.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
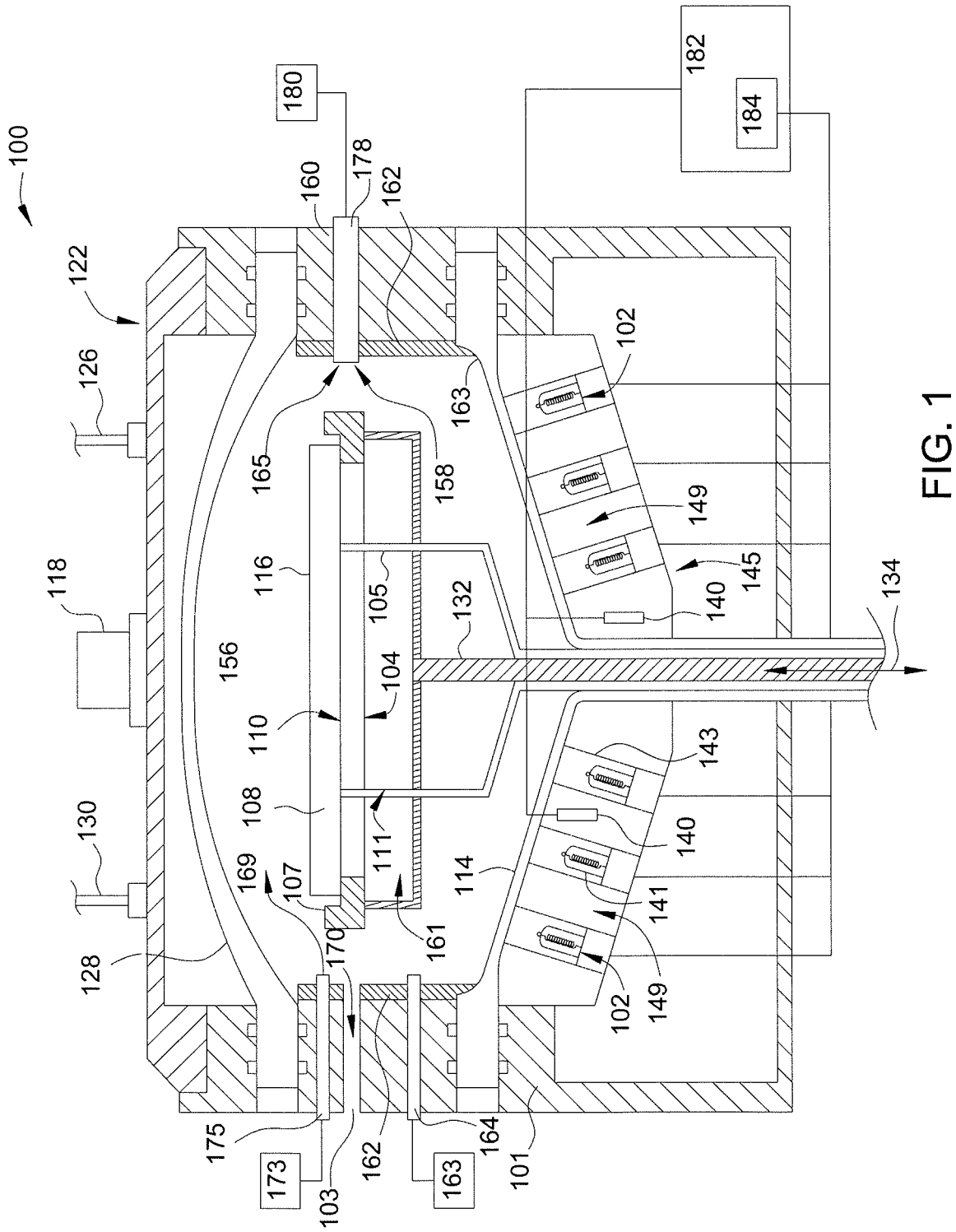
FIG. 1 is a schematic sectional view of a processing chamber according to one embodiment.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods for predictive modeling of metrology in semiconductor processes. Certain details are set forth in the following description and in FIGS. 1-7 to provide a thorough understanding of various implementations of the disclosure. Other details describing well-known structures and systems often associated with plasma etching are not set forth in the following disclosure to avoid unnecessarily obscuring the description of the various implementations.

Many of the details, dimensions, components, and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

As processes (e.g., manufacturing processes) include shorter operation times, smaller parts, tighter tolerances, and so forth, transitions (e.g., how to get from operation A to operation B in a manufacturing process) become more critical. Problems may occur if a process overshoots or undershoots a transition (e.g., transition from 10 degrees to 20 degrees too fast, transition from 10 degrees to 20 degrees too slow, etc.). Repeatable performance includes consistent transitions. Conventional monitoring methods (e.g., SPC) are not capable of monitoring transient time-series and cannot detect short-time signal perturbations in data received from sensors over time (referred to herein as sensor time- series data). These short anomalies can cause defects (e.g., on-substrate defects) or reduce yield.

Time-series excursion analysis provides the ability to monitor time-series excursions in process sensor time-series traces. Time-series excursion analysis may detect rare, strange, and/or unexpected sequences (e.g., shape, magnitude, position, etc. of a curve of the time-series data (value plotted against sample)) that are undetectable via conventional methods. In one embodiment, the monitoring of excursions in time-series data is performed by correlating one or more time series traces to metrology data.

In semiconductor processing, multi-layered features are fabricated on semiconductor substrates using specific processing recipes having many processing operations. A cluster tool, which integrates a number of process chambers to perform a process sequence without removing substrates from a processing environment (e.g., a controlled environment) is generally used in processing semiconductor substrates. A process sequence is generally defined as the sequence of device fabrication operations, or process recipe operations, completed in one or more processing chambers in a cluster tool. A process sequence may generally contain various substrate electronic device fabrication processing operations.

In semiconductor fabrication, each operation must be performed with a sufficient level of precision so that the resulting device functions correctly. Certain defects which occur during the lithography, etching, deposition, or planarization operations may require significant corrective actions in order to rework the substrate. For example, if a substantial misalignment occurs during lithography, in certain cases the substrate must be stripped and lithography must be redone in order to correct the defect. Correcting these defects may result in substantial increases in time and cost. Various parameters of the substrates (e.g., thickness, optical reflective index, absorption index, strength, critical dimension variation across the substrate, and the like) may need to be within acceptable process windows in order for the completed substrate to be of sufficient quality for use. Problems with one or more parameters and the sensors that measure these parameters may require corrective action to be taken with respect to either an individual substrate or aspects of the manufacturing process. Checking all of these parameters for every substrate after the manufacturing process is complete is inefficient and costly. Sometimes, a representative sample of substrates is checked using metrology tools which measure various parameters of the substrates. Because only a representative sample is checked, however, this method of determining the quality of large numbers of substrates can be inaccurate. Therefore, there is a need for a more systematic and efficient way to determine the quality of a large number of manufactured substrates.

Embodiments of the present disclosure involve monitoring and analysis of process excursions in time-series data from one or more sensors located in one or more manufacturing tools of semi-conductor processing equipment. In one implementation, a server extracts one or more time series traces and metrology data collected from one or more sensors associated with one or more manufacturing tools configured to produce a silicon substrate. The server identifies one or more candidate excursions of the one or more time series traces by comparing the one or more time series traces to one or more traces associated with a working reference sensor. The server verifies that a candidate excursion of the one or more candidate excursions is a true excursion based on correlating the one or more time series traces to the metrology data. The server instructs a manufacturing system to take corrective action to remove the selected true excursion.

The server transmits a notification of the verified excursion to a display that displays a dashboard of true excursions, their associated one or more time series traces, their associated metrology data, and their associated sensors. The server rank orders the true excursions and their associated sensors. The server presents on a dashboard of a display the rank ordering of true excursions and their associated sensors. The server receives a selection of a suspected sensor of one of the rank ordered true excursion from the dashboard that caused the excursion. The server identifies one or more operations in a recipe, a particular substrate, a particular chamber, and the tool associated with the selected true excursion that caused the selected true excursion.

The server determines, based on the selected true excursion, its associated time series trace, and associated metrology data, predictive information about a quality of the silicon substrate. The server provides the predictive information to a manufacturing system. Predictive information may be provided so that the predictive information can be analyzed by engineers and so that corrective action may be taken as needed regarding problems which are identified. The server may also determine appropriate corrective action to be taken based on analysis of the data (e.g., based on identifying correlations between tool parameters and substrate parameters throughout the process, and sensor time traces), and provide instructions to perform corrective action. In some embodiments, the server may automatically take corrective action (e.g., recalibrating or adjusting a parameter of a lithography tool, redoing a portion of the manufacturing process for a substrate, and the like) based on the predictive information. In certain embodiments, if the predictive information identifies a problem with one or more parameters of a substrate, the problem may be verified by analyzing the substrate (e.g., using metrology tools). If the problem is confirmed by analyzing the substrate, corrective action may then be taken (e.g., manually or automatically by the processing device).

Embodiments of the present disclosure may allow for efficient and accurate predictions about substrate quality and yield. Furthermore, embodiments may allow for effective determinations to be made regarding improvements with respect to such processes as thin film deposition, etching, and implant processes in order to achieve predictable process windows and optimal thin film properties.

FIG. 1 is a schematic sectional view of a processing chamber 100 according to one embodiment. The processing chamber 100 may be used to process one or more substrates, including deposition of a material on an upper surface of a substrate, such as an upper surface 116 of a substrate 108 depicted in FIG. 1. The processing chamber 100 includes a chamber body 101 connected to, an upper dome 128 and a lower dome 114. In one embodiment, the upper dome 128 may be fabricated from a material such as a stainless steel, aluminum, or ceramics including quartz, including bubble quartz (e.g., quartz with fluid inclusions), alumina, yttria, or sapphire. The upper dome 128 may also be formed from coated metals or ceramics. The lower dome 114 may be formed from an optically transparent or translucent material such as quartz. The lower dome 114 is coupled to, or is an integral part of, the chamber body 101. The chamber body 101 may include a base plate 160 that supports the upper dome 128.

A reflector 122 may be optionally placed outside the upper dome 128 to reflect infrared light that is radiating from the substrate 108 or transmitted by the substrate 108 back onto the substrate 108. Due to the reflected infrared light, the efficiency of the heating will be improved by containing heat that could otherwise escape the processing chamber 100. The reflector 122 can be made of a metal such as aluminum or stainless steel. The reflector 122 can have the inlet portal 126 and exit portal 130 to carry a flow of a fluid such as water for cooling the reflector 122. If desired, the reflection efficiency can be improved by coating a reflector area with a highly reflective coating, such as a gold coating.

A liner assembly 162 may be disposed within the chamber body 101 and is surrounded by the inner circumference of the base plate 160. The liner assembly 162 may be formed from a process-resistant material and generally shields the processing volume (i.e., a process gas region 156 and a purge gas region 158) from metallic walls of the chamber body 101. An opening 170, such as a slit valve, may be disposed through the liner assembly 162 and aligned with the loading port 103 to allow for passage of the substrate 108.

Process gas supplied from a process gas supply source 173 is introduced into the process gas region 156 through a process gas inlet port 175 formed in the sidewall of the base plate 160. Additional openings (not shown) may also be formed in the liner assembly 162 to allow gas to flow therethrough. The process gas inlet port 175 is configured to direct the process gas in a generally radially inward direction. During the film formation process, the susceptor 107 is located in the processing position, which is adjacent to and at about the same elevation as the process gas inlet port 175, thereby allowing the process gas to flow along flow path 169 defined across the upper surface 116 of the substrate 108. The process gas exits the process gas region 156 (along flow path 165) through a gas outlet port 178 located on the opposite side of the processing chamber 100 relative to the process gas inlet port 175. Removal of the process gas through the gas outlet port 178 may be facilitated by a vacuum pump 180 coupled thereto. As the process gas inlet port 175 and the gas outlet port 178 are aligned to each other and disposed approximately at the same elevation, it is believed that such a parallel arrangement will enable a generally planar, uniform gas flow across the substrate 108. Further radial uniformity may be provided by the rotation of the substrate 108 through the susceptor 107.

Purge gas supplied from a purge gas source 163 is introduced to the purge gas region 158 through a purge gas inlet port 164 formed in the sidewall of the base plate 160. The purge gas inlet port 164 is disposed at an elevation below the process gas inlet port 175. The purge gas inlet port 164 is configured to direct the purge gas in a generally radially inward direction. If desired, the purge gas inlet port 164 may be configured to direct the purge gas in an upward direction. During the film formation process, the susceptor 107 is located at a position such that the purge gas flows along flow path 161 across a back side 104 of the susceptor 107. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the susceptor 107). The purge gas exits the purge gas region 158 (along flow path 166) and is exhausted out of the process chamber through the gas outlet port 178 located on the opposite side of the processing chamber 100 relative to the purge gas inlet port 164.

An array of radiant heating lamps 102 is disposed below the lower dome 114 for heating, among other components, a backside 104 of a susceptor 107 disposed within the processing chamber 100. During deposition, the substrate 108 may be brought into the processing chamber 100 and positioned onto the susceptor 107 through a loading port 103. The lamps 102 are adapted to heat the substrate 108 to a predetermined temperature to facilitate thermal decomposition of process gases supplied into the processing chamber to deposit a material onto the upper surface 116 of the substrate 108. In one example, the material deposited onto the substrate 108 may be a Group III, Group IV, and/or Group V material, or a material which includes a Group III, Group IV, and/or Group V dopant. For example, the deposited material may be one or more of gallium arsenide, gallium nitride, or aluminum gallium nitride. The lamps 102 may be adapted to heat the substrate 108 to a temperature of between about 300 degrees Celsius to about 1200 degrees Celsius, such as about 300 degrees Celsius to about 950 degrees Celsius.

The lamps 102 may include bulbs 141 surrounded by an optional reflector 143 disposed adjacent to and beneath the lower dome 114 to heat the substrate 108 as the process gas passes thereover to facilitate the deposition of the material onto the upper surface 116 of the substrate 108. The lamps 102 are arranged in annular groups of increasing radius around a shaft 132 of the susceptor 107. The shaft 132 is formed from quartz and contains a hollow portion or cavity therein, which reduces lateral displacement of radiant energy near the center of the substrate 108, thus facilitating uniform irradiation of the substrate 108.

In one embodiment, each lamp 102 is coupled to a power distribution board (not shown) through which power is supplied to each lamp 102. The lamps 102 are positioned within a lamp head 145 which may be cooled during or after processing by, for example, a cooling fluid introduced into channels 149 located between the lamps 102. The lamp head 145 conductively cools the lower dome 114 due in part to the close proximity of the lamp head 145 to the lower dome 114. The lamp head 145 may also cool the lamp walls and walls of the reflectors 143. If desired, the lamp heads 145 may be in contact with the lower dome 114.

The susceptor 107 is shown in an elevated processing position, but may be moved vertically by an actuator (not shown) to a loading position below the processing position to allow lift pins 105 to contact the lower dome 114. The lift pins 105 pass through holes 111 in the susceptor 107 and raise the substrate 108 from the susceptor 107. A end effector (not shown) may then enter the processing chamber 100 to engage and remove the substrate 108 therefrom through the loading port 103. A new substrate is placed on the susceptor 107, which then may be raised to the processing position to place the substrate 108, with upper surface 116 wherein devices mostly formed thereon facing up, in contact with a front side 110 of the susceptor 107.

An optical pyrometer 118 may be disposed at a region above the upper dome 128. The optical pyrometer 118 measures a temperature of the front side 110 of the susceptor 107 and when the substrate 108 is disposed in the processing chamber 100, the upper surface 116 of the substrate 108. Heating the substrate 108 from the front side 110 of the susceptor 107 in this manner provides for more uniform heating due to the absence of die patterns. As a result of being on the side opposite that of the source ration and being effectively shielded from the source radiation, the optical pyrometer 118 only senses radiation from the hot susceptor 107 or substrate 108, with minimal background radiation from the lamps 102 directly reaching the optical pyrometer 118. In certain embodiments, multiple pyrometers may be used and may be disposed at various locations above the upper dome 128.

A plurality of thermal radiation sensors 140, which may be pyrometers or light pipes, such as sapphire light pipes, may be disposed in the lamp head 145 for measuring thermal emissions of the substrate 108. The sensors 140 are typically disposed at different locations in the lamp head 145 to facilitate viewing (i.e., sensing) different locations of the substrate 108 during processing. In embodiments using light pipes, the sensors 140 may be disposed on a portion of the chamber body 101 below the lamp head 145. Sensing thermal radiation from different locations of the substrate 108 facilitates comparing the thermal energy content, for example the temperature, at different locations of the substrate 108 to determine whether temperature anomalies or non-uniformities are present. Such temperature non-uniformities can result in non-uniformities in film formation, such as thickness and composition. At least two sensors 140 are used, but more than two may be used. Different embodiments may use any number of additional sensors 140. It is noted that these sensors 140 being on the same sides of the substrate 108 as the radiant heating sources may require a correction technique to compensate for the back scattered source radiation.

Each sensor 140 views a zone of the substrate 108 and senses the thermal state of that zone. The zone may be oriented radially in some embodiments. For example, in embodiments where the substrate 108 is rotated, the sensors 140 may view, or define, a central zone in a central portion of the substrate 108 having a center substantially the same as the center of the substrate 108, with one or more zones surrounding the central zone and concentric therewith. It is not required that the zones be concentric and radially oriented. In some embodiments, zones may be arranged at different locations of the substrate 108 in non-radial fashion.

The sensors 140 are typically disposed between the lamps 102, for example in the channels 149, and are usually oriented substantially normal to the upper surface 116 of the substrate 108. In some embodiments the sensors 140 are oriented normal to the substrate 108, while in other embodiments, the sensors 140 may be oriented in slight departure from normal. An orientation angle within about 5° of normal is most frequently used.

The sensors 140 may be attuned to the same wavelength or spectrum, or to different wavelengths or spectra. For example, substrates used in the processing chamber 100 may be compositionally homogeneous, or they may have domains of different compositions. Using sensors 140 attuned to different wavelengths may allow monitoring of substrate domains having different composition and different emission responses to thermal energy. In one embodiment, the sensors 140 are attuned to infrared wavelengths, for example about 3 μm.

During processing, a controller 182 receives data from the sensors 140 and separately adjusts the power delivered to each lamp 102, or individual groups of lamps or lamp zones, based on the data. The controller 182 may include a power supply 184 that independently powers the various lamps 102 or lamp zones. The controller 182 can be configured to produce a desired temperature profile on the substrate 108, and based on comparing the data received from the sensors 140, the controller 182 may adjust the power to lamps and/or lamp zones to conform the observed (i.e., sensed) thermal data indicating of the lateral temperature profile of the substrate with to the desired temperature profile. The controller 182 may also adjust power to the lamps and/or lamp zones to conform the thermal treatment of one substrate to the thermal treatment of another substrate, to prevent chamber performance drift over time.

The controller 182 may be configured to run process recipes, i.e., programs, to instruct control chamber operations. For example, the controller 182 may provide instructions for the purge gas to enter the processing chamber 100 and the lamps 102 to heat the purge gas. Sensors 140 may detect the temperature of the susceptor 107 and provide the temperature information back to the controller 182 for adjusting the lamps 102.

Embodiments of the present disclosure are not limited to plasma or vacuum-based chambers, but are equally applicable to chemical vapor deposition chambers.

Figure 2:
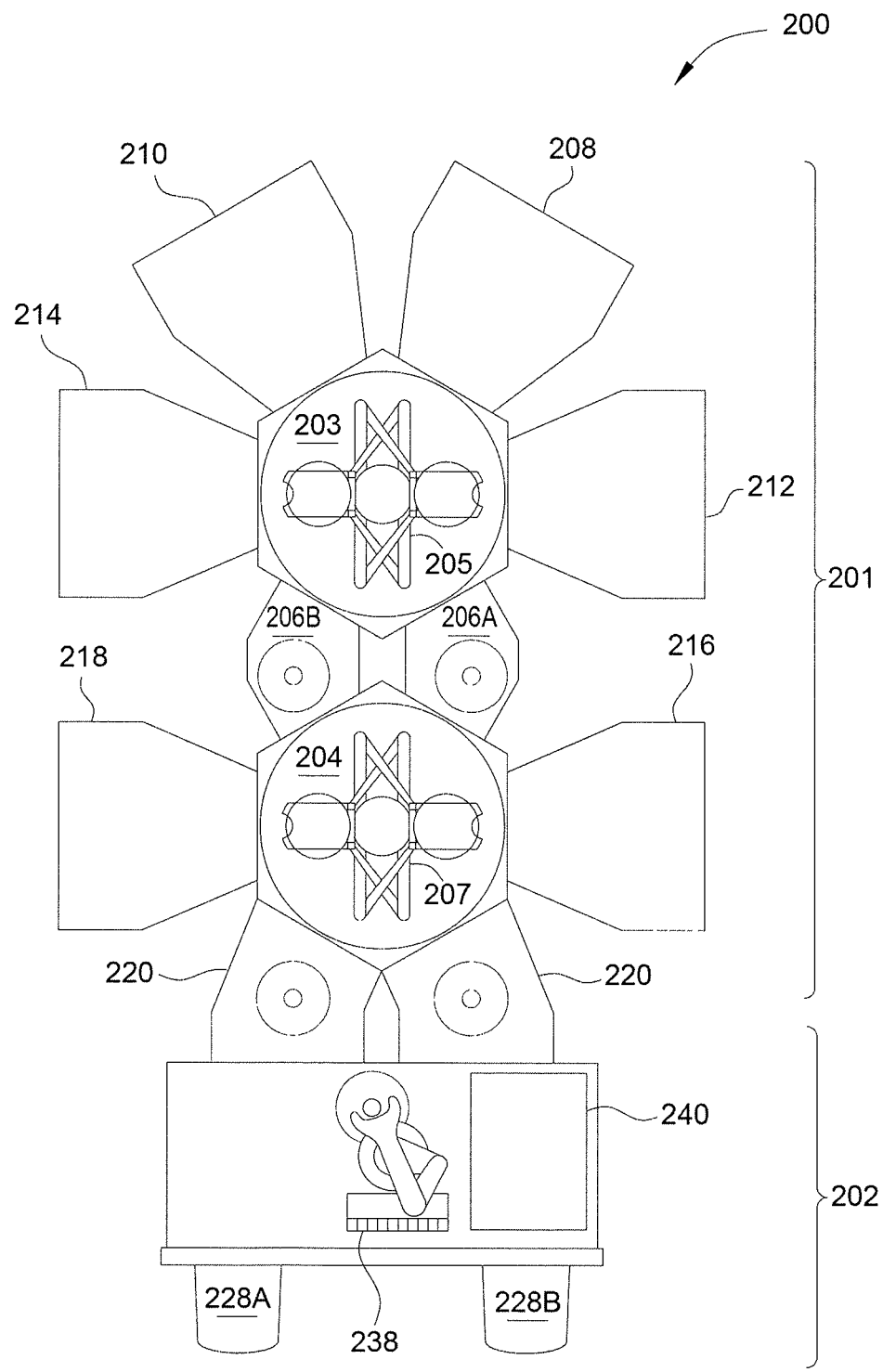
FIG. 2 schematically illustrates one or more manufacturing tools for substrate processing, in accordance with one embodiment of the present disclosure.

FIG. 2 schematically illustrates one or more manufacturing tools 201 for substrate processing, in accordance with one embodiment of the present disclosure. It is contemplated that the method described herein may be practiced in other tools configured to perform a process sequence. For example, the manufacturing tools 201 embodied in FIG. 2 is the ENDURA® cluster tool commercially available from Applied Materials, Inc. in Santa Clara, Calif.

The manufacturing tools 201 include a vacuum-tight set of manufacturing tools 201 and a factory interface 202. The manufacturing tools 201 comprises a plurality of processing chambers 210, 208, 214, 212, 218, 216, such as the processing chamber 100 described in FIG. 1, and at least one load-lock chamber 220, which are coupled to vacuum substrate transfer chambers 103, 104. The factory interface 202 is coupled to transfer chamber 204 by the load lock chamber 220.

In one embodiment, the factory interface 202 comprises at least one docking station, at least one substrate transfer end effector 238, and at least one substrate aligner 240. The docking station is configured to accept one or more front opening unified pods 228 (FOUP). Two FOUPs 228A, 228B are shown in the embodiment of FIG. 2. The substrate transfer end effector 238 is configured to transfer the substrate from the factory interface 202 to the load lock chamber 220.

The load lock chamber 220 has a first port coupled to the factory interface 202 and a second port coupled to a first transfer chamber 204. The load lock chamber 220 is coupled to a pressure control system which pumps down and vents the chamber 220 as needed to facilitate passing the substrate between the vacuum environment of the transfer chamber 204 and the substantially ambient (e.g., atmospheric) environment of the factory interface 202.

The first transfer chamber 204 and the second transfer chamber 203 respectively have a first end effector 207 and a second end effector 205 disposed therein. Two substrate transfer platforms 206A, 206B are disposed in the transfer chamber 204 to facilitate transfer of the substrate between end effectors 205, 207. The platforms 206A, 206B can either be open to the transfer chambers 203, 204 or be selectively isolated (i.e., sealed) from the transfer chambers 203, 204 to allow different operational pressures to be maintained in each of the transfer chambers 203, 204.

The end effector 207 disposed in the first transfer chamber 204 is capable of transferring substrates between the load lock chamber 220, the processing chambers 216, 218, and the substrate transfer platforms 206A, 206B. The end effector 205 disposed in the second transfer chamber 203 is capable of transferring substrates between the substrate transfer platforms 206A, 206B and the processing chambers 212, 214, 210, 208.

Embodiments of the present disclosure involve gathering and analyzing data from sensors associated with various processes and parameters of substrates during the manufacturing process from various manufacturing tools 201 in order to detect and possibly eliminate excursions. In some embodiments, the manufacturing tools are associated with a manufacturing execution system (MES). The data may include, for example, time-series traces of various sensors, such as the sensors 140 of FIG. 1, and from metrology data taken from sensors that measure parameters of a substrate. The data may be aggregated and analyzed at a central location, such as a server, and used to detect anomalies/excursions in real-time. For example, the server may use fundamental statistical processes or stochastic-based analyses of a time-series trace of a particular sensor designated as having a candidate excursion correlated with corresponding metrology data in order confirm that the candidate excursion is an actual excursion and not a false positive. In some embodiments, the server may make predictive determinations about the overall quality of the substrate based on identified true excursions.

Predictive information may be provided from the server to the MES so that the predictive information can be analyzed by engineers and so that corrective action may be taken as needed regarding problems which are identified as a result of true excursions. The server may also determine appropriate corrective action to be taken based on analysis of the data (e.g., based on identifying correlations between time series traces of sensors and metrology data taken from other sensors that measure parameters of a substrate), and provide instructions to perform corrective action. In some embodiments, the MES may automatically take corrective action (e.g., recalibrating or adjusting a parameter of a lithography tool, redoing a portion of the manufacturing process for a substrate, or other suitable computing device) based on the predictive information. In certain embodiments, if the predictive information identifies a problem with one or more parameters of a substrate, the problem may be verified by analyzing the substrate (e.g., using metrology tools). If the problem is confirmed by analyzing the substrate, corrective action may then be taken (e.g., manually or automatically by the MES).

Figure 3:
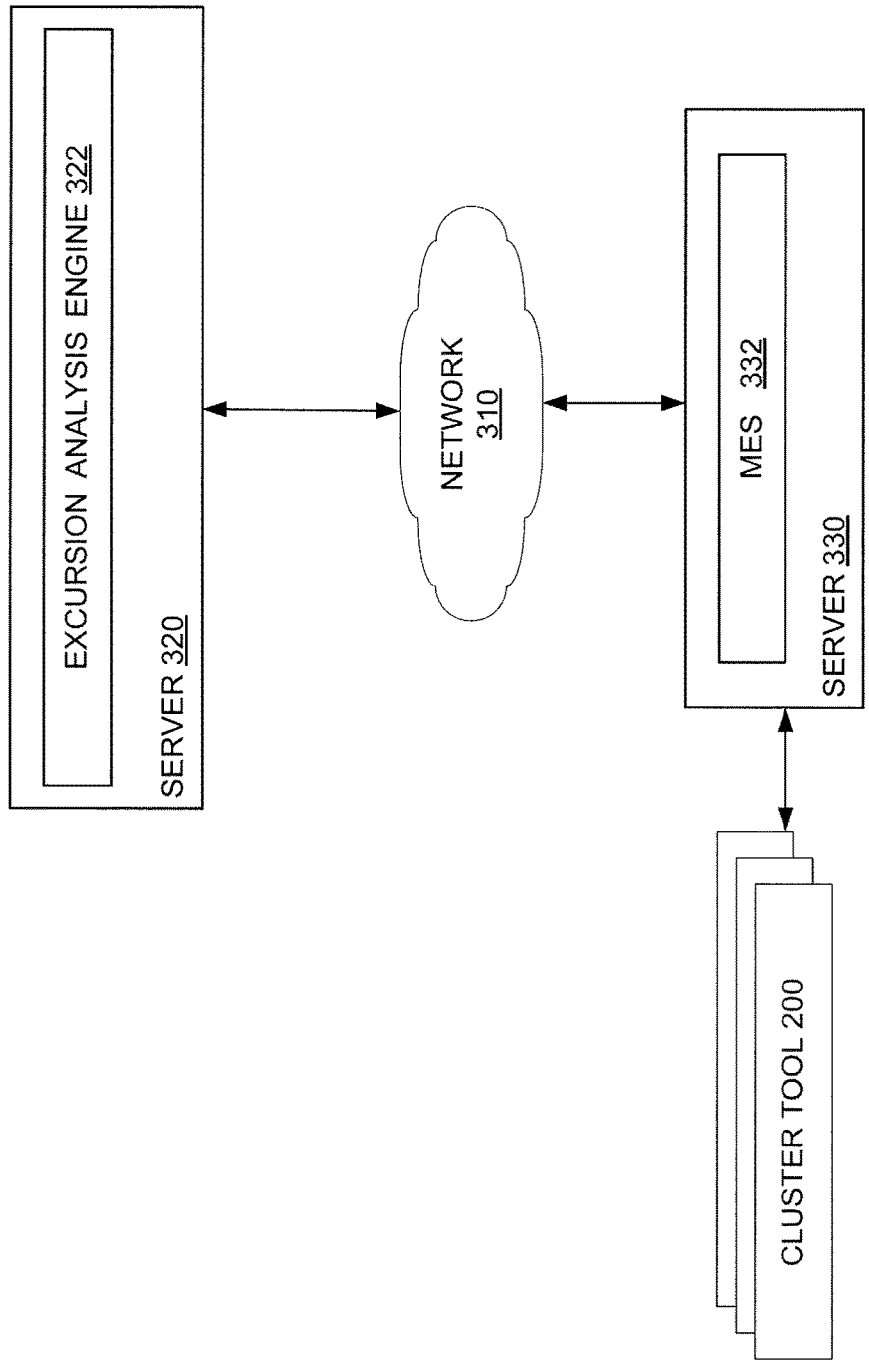
FIG. 3 depicts a network environment in which embodiments of the present disclosure may be implemented.

FIG. 3 depicts a network environment 300 in which embodiments of the present disclosure may be implemented. As shown, network environment 300 includes a server 320 which is connected via network 310 to another server 330 which is connected to one or more cluster tools 200. Network 310 may, for example, comprise the Internet. In another embodiment, manufacturing tools 340 is also connected directly to server 320.

Server 320 may comprise a computing device such as a rack server, desktop or laptop computer, mobile phone, tablet, or other suitable computing device. As shown, server 320 comprises an excursion analysis engine 322, which may perform operations described herein related to making determinations and predictions regarding identifying and correcting excursions. The excursion analysis engine 322 identifies data sources 306A-N (e.g., sensors) that define a system and/or that are used to monitor a system, such as the collection of manufacturing tools 340 corresponding to manufacturing tools 201. The manufacturing tools 340 may be semiconductor processing equipment, such as one or more of a chamber for an etch reactor, a deposition chamber, and so on, corresponding to the platform 201 comprises the plurality of processing chambers 210, 208, 214, 212, 218, 216, of FIG. 2, such as the processing chamber 100 described in FIG. 1.

For example, excursion analysis engine 322 may analyze time-series sensor information received from MES 332 or directly from the manufacturing tools 340 in order to detect, analyze, and verify excursions.

For example, the excursion analysis engine 322 may analyze process and substrate sensor information received from MES 332 or directly from sensors applied within the manufacturing tools 340 in order to detect excursions, corrective actions to eliminate future excursions in the same sensors, and process improvements. In some embodiments, the server 320 is separate from the manufacturing tools 340. In other embodiments, the server may be part of the manufacturing tools 340 or may be an off-line server.

For example the excursion analysis engine 322 may receive time-series sensor traces from MES 332 representing temperature, gas flow, or RF power current, etc. collected from one or more sensors associated with one or more manufacturing tools configured to produce a silicon substrate. The excursion analysis engine 322 may further receive metrology data which may include parameters related to the manufacturing of a substrate (e.g., tool parameters, thickness, optical reflective index, absorption index, strength, overlay and alignment data, critical dimension variation across the substrate, and the like) and representing the behavior of various parameters of a substrate and manufacturing tools throughout the manufacturing process (e.g., substrate parameters may be captured by sensors associated with the manufacturing tools 340). The excursion analysis engine 322 may identify one or more candidate excursions of the time series traces by comparing the time series traces to one or more traces associated with a working reference sensor. The excursion analysis engine 322 may analyze the data using statistical processes in order to verify that an excursion is not a false positive by correlating the series traces to the metrology data.

In some embodiments, the excursion analysis engine 322 may convert the data into a parameter-agnostic and measurement-unit-agnostic space (e.g., a generic format based on relative differences) before performing analysis calculations. Calculations may involve the use of stochastic-based processes. Once the excursion analysis engine 322 verifies that a candidate excursion is a true excursion in a sensor, the results of the calculations may be converted back to the original parameter-specific space (e.g., the original measurement units for each parameter). The excursion analysis engine 322 may provide predictive information to MES 332 about future excursions in the sensor data. In some embodiments, the excursion analysis engine 322 may also determine corrective action to be taken with respect to processes or individual substrates based on the data. For example, the excursion analysis engine 322 may identify a correlation between a measured excursion associated with a temperature sensor correlated with a certain substrate parameter problem and a tool parameter, and determine that the tool parameter should be adjusted by a certain amount. Furthermore, the excursion analysis engine 322 may determine actions to be performed on a substrate to bring one or more predicted parameters into an acceptable range (e.g., correcting overlay marks, stripping and recoating the substrate, and the like).

Predictive information regarding substrate quality with respect to parameters may permit personnel or MES 332 to improve the manufacturing process (e.g., lithography, etching, deposition, and planarization may be improved to achieve predictable properties).

Server 330 may comprise a computing device such as a rack server, desktop or laptop computer, mobile phone, tablet, or other suitable computing device. As shown, server 320 comprises an MES 332, which may perform operations described herein related to managing the manufacturing of silicon substrates. For example, MES 332 may coordinate processes performed by the manufacturing tools 340, and may collect data from these tools (e.g., tool parameters, thickness, optical reflective index, absorption index, strength, overlay and alignment data, critical dimension variation across the substrate, and the like) and time traces from sensors used by the manufacturing tools 340. In some embodiments, the data may be time-series traces which represent the behavior of sensors over time as manufacturing processes are performed. MES 332 may provide this information to the excursion analysis engine 322 (e.g., over network 310), which may analyze the information and provide verification of the detection of excursions. In some embodiments, the excursion analysis engine 322 may provide instructions to MES 332 regarding corrective action to take with respect to an individual defect, the manufacturing tools 340, or other aspects of the manufacturing process. In certain embodiments, MES 332 automatically takes corrective action, such as by instructing individual sensors of individual chambers within the manufacturing tools 340 to perform certain tasks (e.g., instructing a lithography tool to strip and recoat a substrate in order to correct an alignment defect or instructing a deposition tool to alter one or more parameters).

The manufacturing tools 340 may comprise one or more tools which perform processes related to manufacturing silicon substrates. For example, the manufacturing tools 340 may include lithography tools, etching tools, deposition tools, and planarization tools. The manufacturing tools 340 may communicate with MES 332 in order to receive instructions and provide data from sensors within a particular tool (e.g., time-series data representing the values output by one or more sensors associate with of parameters of substrates captured by sensors over time during manufacturing).

Figure 4:
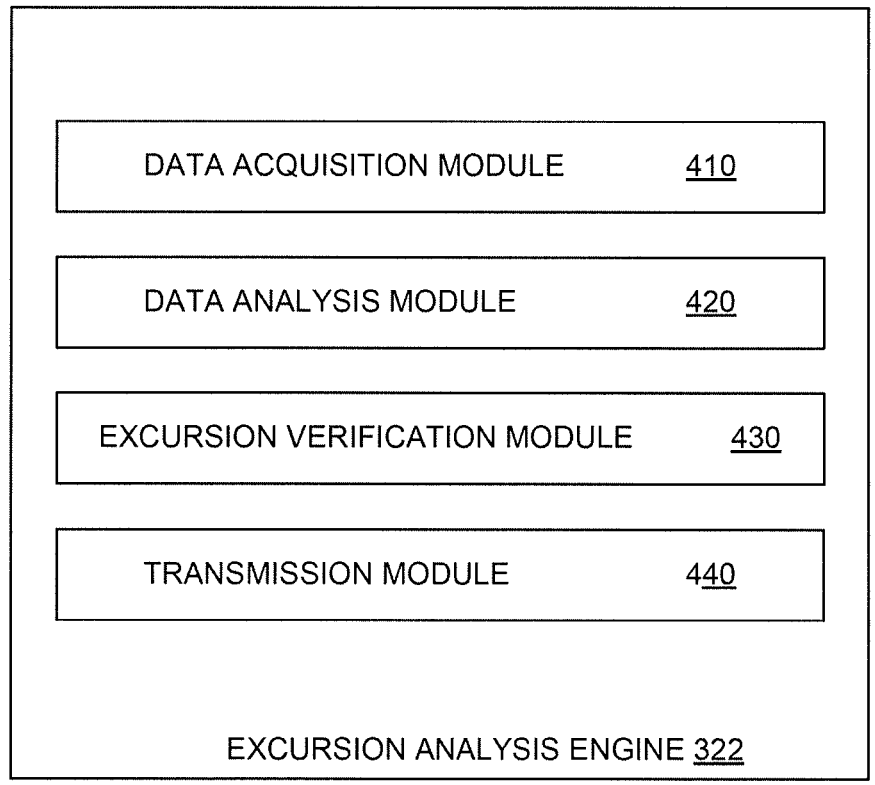
FIG. 4 illustrates components of an excursion analysis engine according to embodiments of the present disclosure.

FIG. 4 illustrates components of excursion analysis engine 322 according to embodiments of the present disclosure. As shown, the excursion analysis engine 322 includes a data acquisition module 410, which may acquire data from MES 332 (e.g., over network 310). In alternative embodiments, data acquisition module 410 acquires data directly from sensors within the manufacturing tools 340. The excursion analysis engine 322 further includes a data analysis module 420, which may analyze data received from MES 132 (e.g., using statistical processes). In some embodiments, data analysis module 420 converts data into a parameter-agnostic and measurement-unit-agnostic space before performing calculations, and then converts the results of the calculations back into the original parameter-specific space for each parameter. The excursion analysis engine 322 further includes an excursion verification module 430, which verifies whether a candidate excursion is a valid excursion or a false positive and other aspects of the manufacturing process (e.g., corrective actions and process improvements) based on determinations made by data analysis module 420. Data analysis module 420 and excursion verification module 430 may, for example, work together to make determinations based on fundamental statistical processes and stochastic-based analyses of time-series data received from MES 332. The excursion analysis engine 322 further includes a transmission module 440, which may transmit data such as sensor information and corrective instructions to MES 332 (e.g., over network 310) or to other destinations.

Figure 5A:
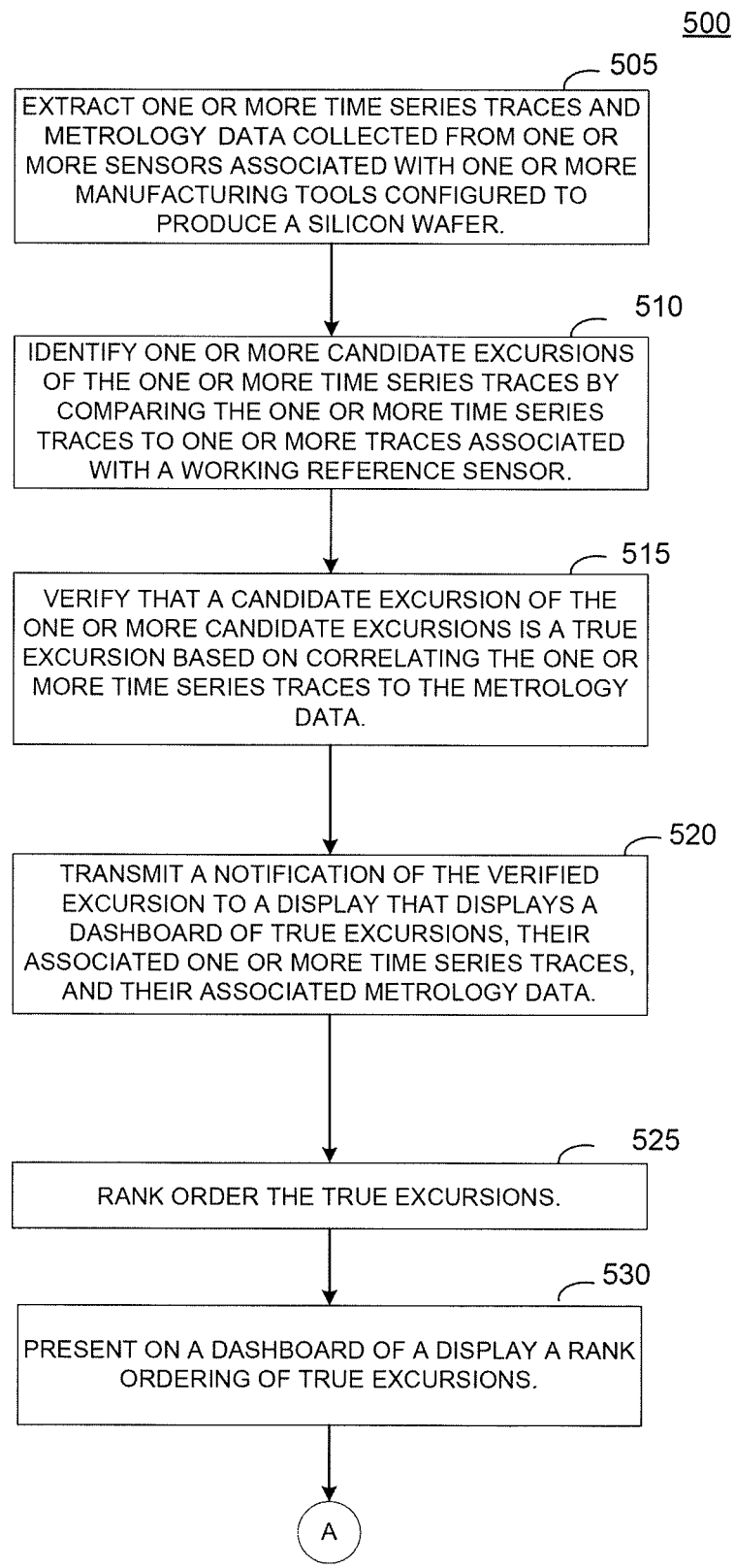
FIGS. 5A and 5B illustrate one embodiment of a method for detecting excursions in time-series data received from one or more sensors of the manufacturing tools.
Figure 5B:
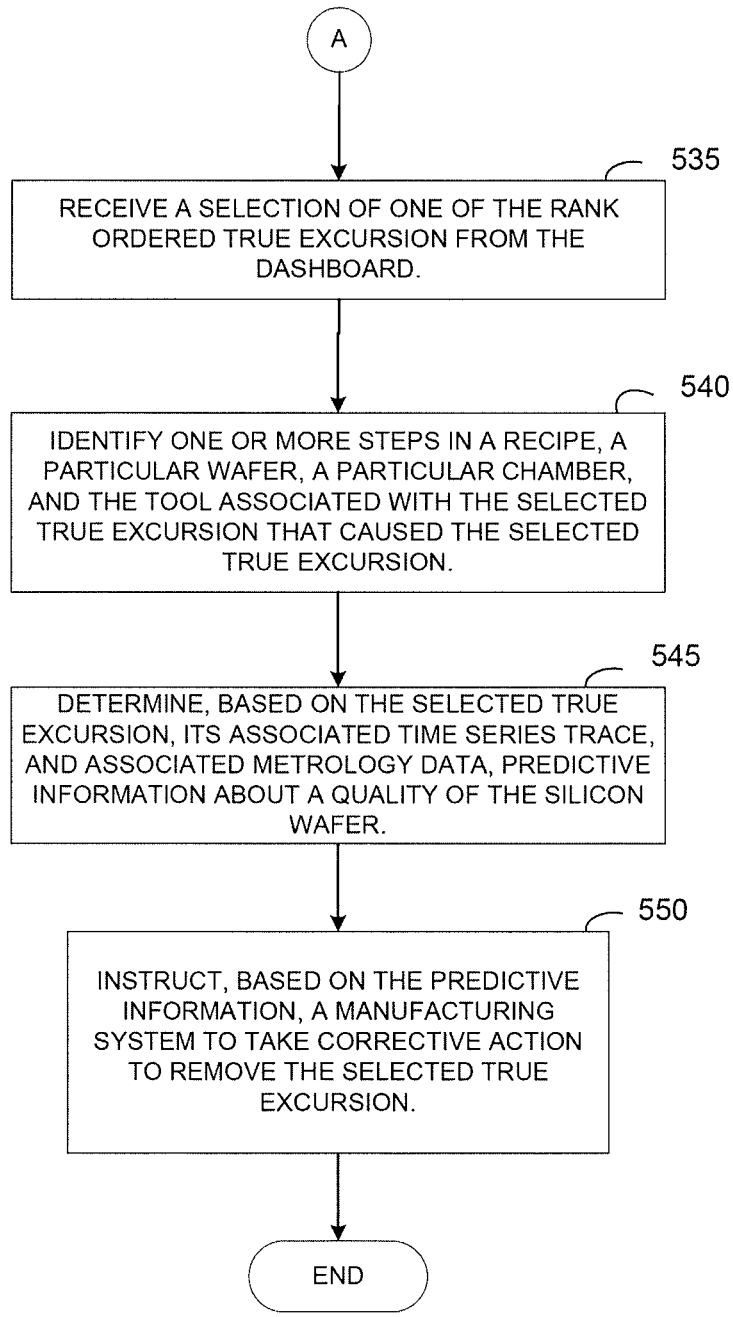

FIGS. 5A and 5B illustrate one embodiment of a method 500 for detecting excursions in time-series data received from one or more sensors of the manufacturing tools 340. Method 500 can be performed by processing logic that can comprise hardware (e.g., circuitry, dedicated logic, programmable logic, microcode, etc.), software (e.g., instructions run on a processing device), or a combination thereof. In one embodiment, method 500 is performed by the excursion analysis engine 322 of FIG. 3.

At block 505, the excursion analysis engine 322 extracts one or more time series traces (e.g., a target signal) and metrology data collected from one or more sensors associated with one or more manufacturing tools 340 configured to produce a silicon substrate. The one or more time series traces comprise information about at least one of temperature, gas flow, or RF power current. The one or more sensors may generate the time-series data during a process (e.g., a manufacturing process) of the manufacturing tools 340. The time-series data may include a first plurality of data points. The first plurality of data points may include data points at samples of the time-series data.

The metrology data may comprise parameters related to the manufacturing of a substrate. For example, the excursion analysis engine 322 may receive information from MES 332, acquired from one or manufacturing tools 340, (e.g., tool parameters, thickness, optical reflective index, absorption index, strength, overlay and alignment data, critical dimension variation across the substrate, and the like). In another embodiment, the excursion analysis engine 322 receives the data directly from manufacturing tools 340.

At block 510, the excursion analysis engine 322 identifies one or more candidate excursions of the one or more time series traces by comparing the one or more time series traces to one or more traces associated with a working reference sensor.

At block 515, the excursion analysis engine 322 verifies that a candidate excursion of the one or more candidate excursions is a true excursion based on correlating the one or more time series traces to the metrology data. In one embodiment, the correlating correlates the true excursion to a particular sensor of the one or more sensors. In another embodiment, the correlating correlates the true excursion to a particular substrate processing operation in a particular tool of the one or more manufacturing tools. The correlating is based on applying a combination of stochastics and machine learning algorithms to the one or more time series traces and the metrology data.

At block 520, the excursion analysis engine 322 transmits a notification of the verified excursion to a display that displays a dashboard of true excursions, their associated one or more time series traces, their associated metrology data, and their associated sensors.

At block 525, the excursion analysis engine 322 rank orders the true excursions and their associated sensors. At block 530, the excursion analysis engine 322 presents on a dashboard of a display the rank ordering of true excursions and their associated sensors. At block 535, the excursion analysis engine 322 receives a selection of a suspected sensor of one of the rank ordered true excursion from the dashboard that caused the excursion. At block 540, the excursion analysis engine 322 identifies one or more operations in a recipe, a particular substrate, a particular chamber, and the tool associated with the selected true excursion that caused the selected true excursion. At block 545, the excursion analysis engine 322 determines, based on the selected true excursion, its associated time series trace, and associated metrology data, predictive information about a quality of the silicon substrate. At block 550, the excursion analysis engine 322 instructs, based on the predictive information, a manufacturing system to take corrective action to remove the selected true excursion.

The excursion analysis engine 322 provides the predictive information to MES 332 (or to another system) so that it can be analyzed by professionals and/or used to take corrective action. In some embodiments, the MES 332 may automatically take corrective action based on the predictive information (e.g., based on instructions for corrective action included with the predictive information). In some embodiments, the MES 332 (or, alternatively, the excursion analysis engine 322) may verify aspects of the predictive information by instructing inspection of the substrate. For example, if the predictive information indicates that the thickness of a substrate is not within an acceptable range, the MES 332 may instruct one or more of manufacturing tools 340 to scan the thickness of the substrate and determine whether the prediction as accurate. If the prediction was accurate, corrective action may be taken (e.g., initiated manually by a professional or automatically by the MES 332). If the prediction is inaccurate, the excursion analysis engine 322 may store this information as a reference point for future predictive determinations.

Figure 6:
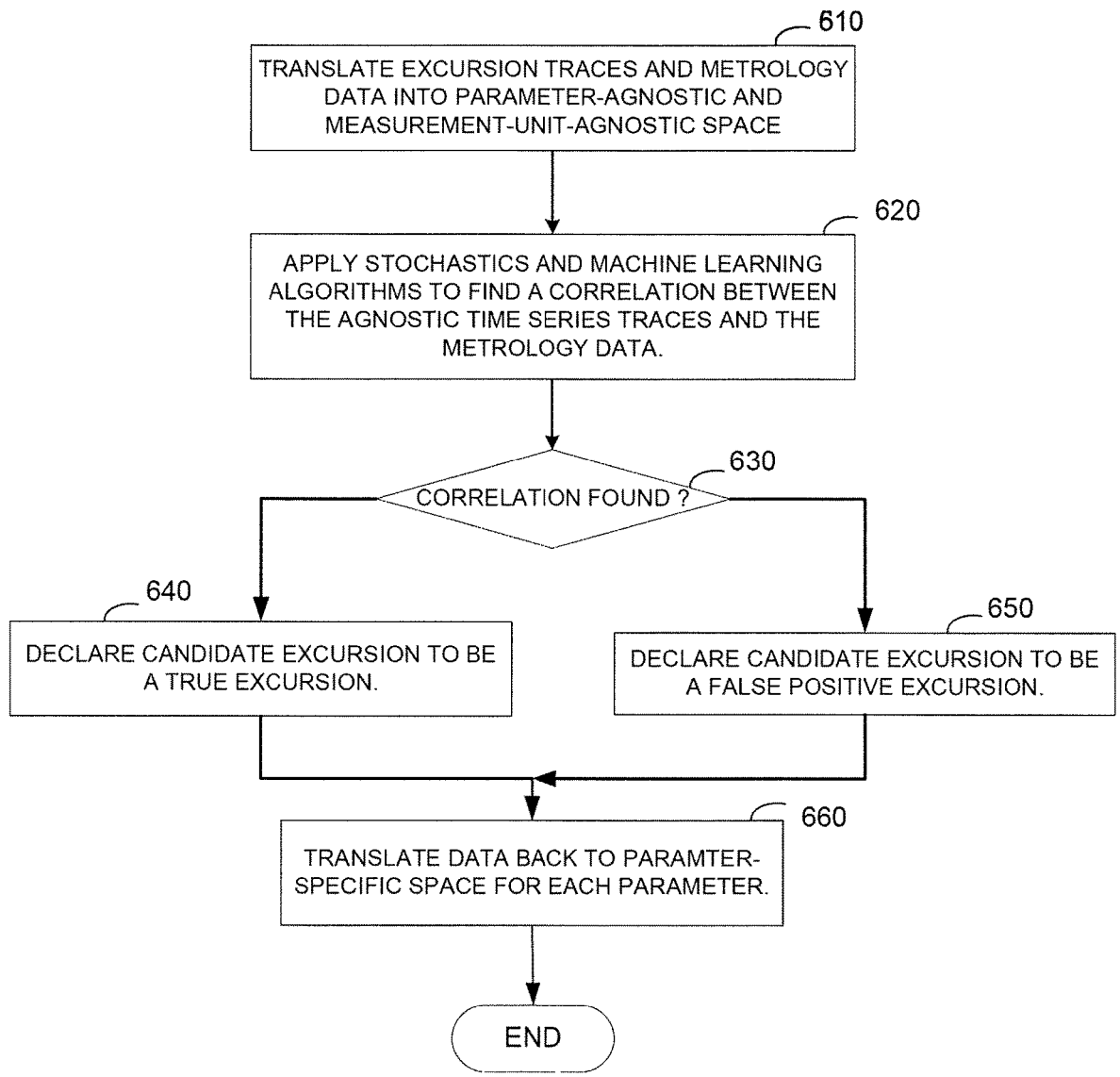
FIG. 6 illustrates a verification operation of FIGS. 5A and 5B in greater detail.

FIG. 6 illustrates verification operation 515 in greater detail. Method operation 515 can be performed by processing logic that can comprise hardware (e.g., circuitry, dedicated logic, programmable logic, microcode, etc.), software (e.g., instructions run on a processing device), or a combination thereof. In one embodiment, method operation 515 is performed by the excursion analysis engine 322 of FIG. 3.

At block 610, the excursion analysis engine 322 translates excursion traces and metrology data into parameter-agnostic and measurement-unit-agnostic space. For example, the excursion analysis engine 322 may perform a transformation on relative differences to convert the time-series data from its original format (sometimes referred to as n-dimensional space) into a generic space or format which is not tied to any particular parameter or unit of measure (sometimes referred to as k-dimensional space). This allows for correlations to be identified between parameters which may be measured in different units.

At block 620, the excursion analysis engine 322 applies stochastics and machine learning algorithms to find a correlation between the agnostic time series traces and the metrology data. The excursion analysis engine 322 may identify correlations between different metrological parameters and time-series trace data and use statistical processes or stochastic-based analyses in order to identify a true excursion.

If, at block 630, a correlation is found, then at block 640, the excursion analysis engine 322 declares the candidate excursion to be a true excursion. if, at block 630, a correlation is found, then at block 650, the excursion analysis engine 322 declares the candidate excursion to be a false positive excursion.

At block 660, the excursion analysis engine 322 translates the data back to parameter-specific space or format for each parameter (e.g., from k-space back to n-space). This allows for the final correlated metrological parameter values and time trace data to be understood in their proper format.

Figure 7:
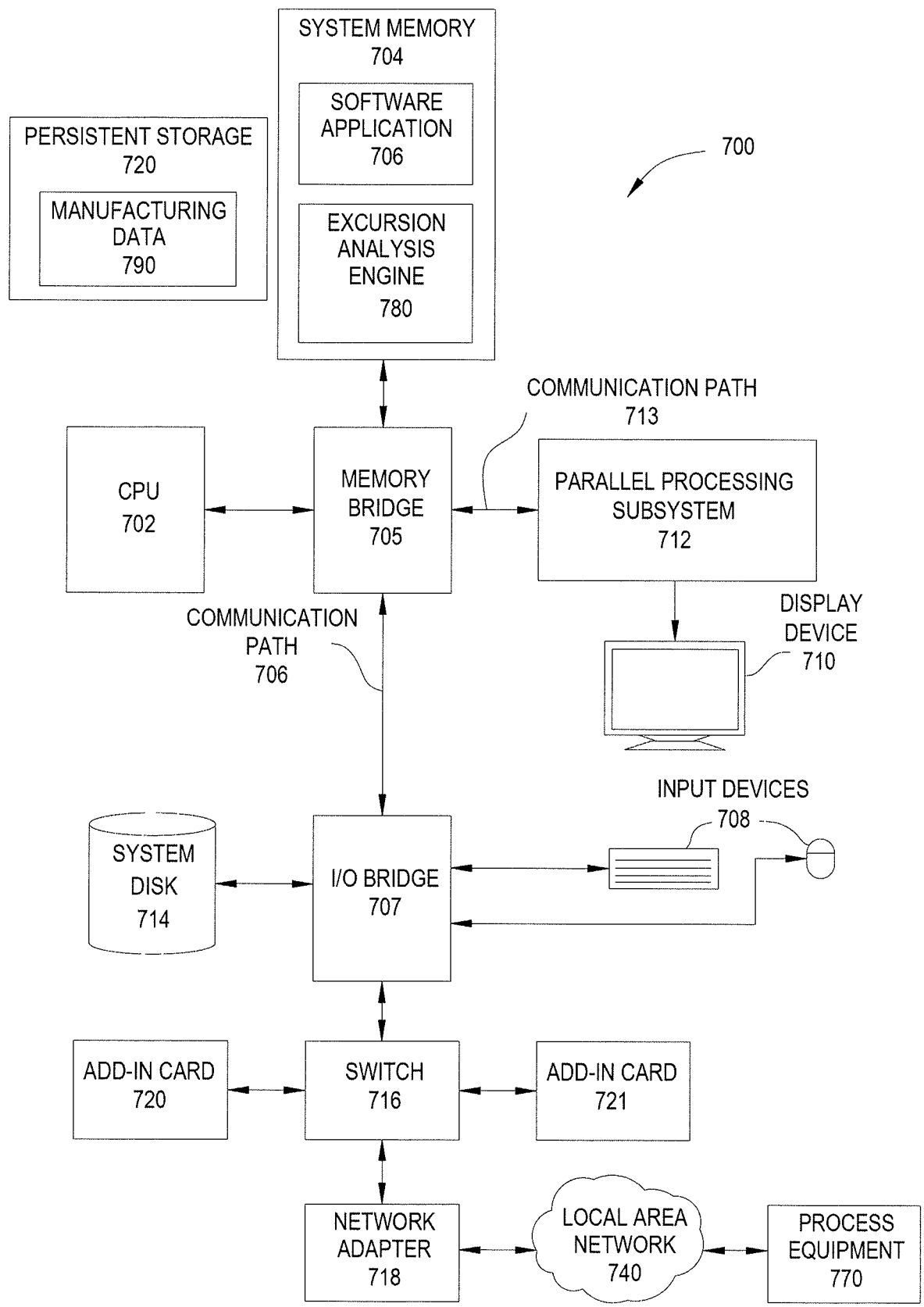
FIG. 7 depicts an example computer system with which embodiments of the present disclosure may be implemented.

FIG. 7 illustrates an example computing system 700 used to detect and analyze excursions, according to some embodiments of the present disclosure. In certain embodiments, computer system 700 is representative of the server 320. Aspects of computer system 700 may also be representative of other devices used to perform techniques described herein (e.g., server 330). For example, computing system 700 may be a personal computer, industrial processor, personal digital assistant, mobile phone, mobile device or any other device suitable for practicing one or more embodiments of the present invention.

The system 700 includes a central processing unit (CPU) 702 and a system memory 704 communicating via a bus path that may include a memory bridge 705. CPU 702 includes one or more processing cores, and, in operation, CPU 702 is the master processor of the system 700, controlling and coordinating operations of other system components. System memory 704 stores a software application 706, and data, for use by CPU 702. CPU 702 runs software applications and optionally an operating system.

Illustratively, the system memory 704 includes the excursion analysis system 780, which may correspond to the excursion analysis engine 322, which performs operations related to detecting sensor excursions, according to techniques described herein. For example, the excursion analysis engine 780 may be equivalent to the excursion analysis engine 322 in FIG. 3, and may use fundamental statistical processes and stochastic-based analyses of data captured during substrate manufacturing to detect and verify sensor excursions and other aspects of the manufacturing process.

Memory bridge 705, which may be, e.g., a Northbridge chip, is connected via a bus or other communication path (e.g., a HyperTransport link) to an I/O (input/output) bridge 707. I/O bridge 707, which may be, e.g., a Southbridge chip, receives user input from one or more user input devices 708 (e.g., keyboard, mouse, joystick, digitizer tablets, touch pads, touch screens, still or video cameras, motion sensors, and/or microphones) and forwards the input to CPU 702 via memory bridge 705.

A display processor 712 is coupled to the memory bridge 705 via a bus or other communication path (e.g., a PCI Express, Accelerated Graphics Port, or HyperTransport link); in one embodiment display processor 712 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 704.

Display processor 712 periodically delivers pixels of the dashboard to a display device 710 (e.g., a screen or conventional CRT, plasma, OLED, SED or LCD based monitor or television). Additionally, display processor 712 may output pixels to film recorders adapted to reproduce computer generated images on photographic film. Display processor 712 can provide display device 710 with an analog or digital signal.

Persistent storage 720 is also connected to I/O bridge 707 and may be configured to store content and applications and data, such as a database library 715, for use by CPU 702 and display processor 712. Persistent storage 720 provides non-volatile storage for applications and data and may include fixed or removable hard disk drives, flash memory devices, and CD-ROM, DVD-ROM, Blu-ray, HD-DVD, or other magnetic, optical, or solid state storage devices.

Illustratively, persistent storage 720 includes manufacturing data 790, which may comprise information acquired by the excursion analysis engine 322. Manufacturing data 790 may, for example, comprise information received from MES 332, collected by the manufacturing tools 340, related to various sensors taking measurements from substrates and tools over time during the manufacturing processes.

A switch 716 provides connections between the I/O bridge 707 and other components such as a network adapter 718 and various add-in cards 720 and 721. Network adapter 718 allows the system 700 to communicate with other systems via an electronic communications network, and may include wired or wireless communication over local area networks 740 and wide area networks such as the Internet.

Other components (not shown), including USB or other port connections, film recording devices, or other suitable computing device, may also be connected to I/O bridge 707. For example, process equipment 770 may operate from instructions and/or data provided by CPU 702, system memory 704, or persistent storage 720. Communication paths interconnecting the various components in FIG. 7 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

The process equipment 770 may be one or more semiconductor chambers such as a plasma enhanced chemical vapor deposition (PECVD) or other plasma processing tool, such as the processing tools contained in the manufacturing tools 340. For example, process equipment 770 may be an etch chamber, a chemical vapor deposition chamber, a physical vapor deposition chamber, an implant chamber, a plasma treatment chamber, or other plasma processing chamber, either alone or in combination with one or more other chambers, such as processing chamber 100.

In one embodiment, display processor 712 incorporates circuitry optimized for performing mathematical operations, including, for example, math co-processor, and may additionally constitute a graphics processing unit (GPU). In another embodiment, display processor 712 incorporates circuitry optimized for general purpose processing. In yet another embodiment, display processor 712 may be integrated with one or more other system elements, such as the memory bridge 705, CPU 702, and I/O bridge 707 to form a system on chip (SoC). In still further embodiments, display processor 712 is omitted and software executed by CPU 702 performs the functions of display processor 712.

Pixel data can be provided to display processor 712 directly from CPU 702. In some embodiments, instructions and/or data representing an excursion verification analysis is provided to set of server computers, each similar to the system 700, via network adapter 718 or system disk 714. The servers may perform operations on subsets of the data using the provided instructions for analysis. The results from these operations may be stored on computer-readable media in a digital format and optionally returned to the system 700 for further analysis or display. Similarly, data may be output to other systems for display, stored in a database library 715 on the system disk 714, or stored on computer-readable media in a digital format.

Alternatively, CPU 702 provides display processor 712 with data and/or instructions defining the desired output images, from which display processor 712 generates the pixel data of one or more output images, including characterizing and/or adjusting the offset between stereo image pairs. The data and/or instructions defining the desired output images can be stored in system memory 704 or graphics memory within display processor 712. CPU 702 and/or display processor 712 can employ any mathematical, function or technique known in the art to create one or more results from the provided data and instructions, including running models and comparing data from sensors to track the service life of chamber components.

It will be appreciated that the system shown herein is illustrative and that variations and modifications are possible. The connection topology, including the number and arrangement of bridges, may be modified as desired. For instance, in some embodiments, system memory 704 is connected to CPU 702 directly rather than through a bridge, and other devices communicate with system memory 704 via memory bridge 705 and CPU 702. In other alternative topologies display processor 712 is connected to I/O bridge 707 or directly to CPU 702, rather than to memory bridge 705. In still other embodiments, I/O bridge 707 and memory bridge 705 might be integrated into a single chip. The particular components shown herein are optional; for instance, any number of add-in cards or peripheral devices might be supported. In some embodiments, the process equipment 770 may be connected directly to the I/O bridge 707. In some embodiments, the switch 716 is eliminated, and the network adapter 718 and the add-in cards 720, 721 connect directly to the I/O bridge 707.

Various embodiments of the invention may be implemented as a program product for use with a computer system. The software routines of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Any combination of one or more computer readable medium(s) may be utilized for storing a program product which, when executed, is configured to perform method for determining the service life of a chamber components. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA TM, SMALLTALK TM, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Advantageously, the techniques presented herein allow for intelligent predictions of substrate quality based on manufacturing data, and allow for efficient decisions to be made regarding corrective actions to be taken with respect to individual substrates and other aspects of the manufacturing process. Use of embodiments of the present disclosure may reduce costs, improve efficiency, and allow for better strategic planning with respect to the manufacturing process.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present invention may take the form of a computer program product embodied in one or more computer readable medium(s) having computer readable program code embodied thereon. The controller 182 may computer or other suitable device for controlling the processing chamber 100. Aspects of the invention may run on the controller 182 or external device attached to the controller 182.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples a computer readable storage medium include: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the current context, a computer readable storage medium may be any tangible medium that can contain, or store a program.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

The invention claimed is:

1. A method for detecting excursions in time-series traces received from sensors of manufacturing tools, comprising:
   extracting one or more time series traces and metrology data collected from one or more sensors associated with one or more manufacturing tools configured to produce a silicon substrate, wherein the one or more time series traces includes a time transition associated with the one or more sensors between a first semiconductor processing operation on the silicon substrate and a second semiconductor processing operation on the silicon substrate;
   identifying one or more candidate excursions of the one or more time series traces by comparing the one or more time series traces to one or more traces associated with a working reference sensor;
   verifying that a candidate excursion of the one or more candidate excursions is a true excursion based on correlating the one or more time series traces to the metrology data;
   rank ordering the true excursion within a plurality of true excursions, and presenting the rank ordering of the plurality of true excursions and at least one sensor associated with each of the plurality of true excursions on a dashboard;
   receiving a selection of a suspected sensor of the one or more sensors, associated with the true excursion; and
   instructing a manufacturing system to take corrective action to remove a source of the true excursion related to the first or second semiconductor processing operations on the silicon substrate.

2. The method of claim 1, wherein correlating correlates the true excursion to a particular sensor of the one or more sensors.

3. The method of claim 1, wherein correlating correlates the true excursion to a particular substrate processing operation in a particular tool of the one or more manufacturing tools.

4. The method of claim 1, wherein correlating is based on applying a combination of stochastics and machine learning algorithms to the one or more time series traces and the metrology data.

5. The method of claim 1, wherein the metrology data comprises information about at least one of a thickness, an optical reflective index, an absorption index, a strength, and a critical dimension variation across the silicon substrate.

6. The method of claim 1, wherein the one or more time series traces comprises information about at least one of temperature, gas flow, and RF power current.

7. The method of claim 1, further comprising transmitting a notification of the verified excursion to a display that displays a dashboard of true excursions, their associated one or more time series traces, and their associated metrology data.

8. The method of claim 1, further comprising:
   identifying one or more operations in a recipe, a particular substrate, a particular chamber, and the tool associated with the true excursion that caused the true excursion.

9. The method of claim 8, further comprising:
   determining, based on the true excursion, its associated time series trace, and associated metrology data, predictive information about a quality of the silicon substrate;
   providing the predictive information to a manufacturing system, wherein the predictive information is further used to determine whether to take corrective action to remove the true excursion.

10. The method of claim 9, further comprising:
    providing the predictive information to a metrology tool, wherein the metrology tool checks for a problem based on the predictive information.

11. The method of claim 1, converting the one or more time series traces and the metrology data from a parameter-specific space into a parameter-agnostic space before performing one or more calculations before verifying.

12. The method of claim 11, further comprising converting a result of verifying back into the parameter specific space.

13. A computing system, comprising:
    a memory; and
    a processor configured to perform a method for detecting excursions in time-series traces received from sensors of manufacturing tools, the method comprising:
       extracting one or more time series traces and metrology data collected from one or more sensors associated with one or more manufacturing tools configured to produce a silicon substrate, wherein the one or more time series traces includes a time transition associated with the one or more sensors between a first semiconductor processing operation on the silicon substrate and a second semiconductor processing operation on the silicon substrate;

identifying one or more candidate excursions of the one or more time series traces by comparing the one or more time series traces to one or more traces associated with a working reference sensor;

verifying that a candidate excursion of the one or more candidate excursions is a true excursion based on correlating the one or more time series traces to the metrology data;

rank ordering the true excursion within a plurality of true excursions, and presenting the rank ordering of the plurality of true excursions and at least one sensor associated with each of the plurality of true excursions on a dashboard;

receiving a selection of a suspected sensor of the one or more sensors, associated with the true excursion; and instructing a manufacturing system to take corrective action to remove a source of the true excursion related to the first or second semiconductor processing operations on the silicon substrate.

14. The computing system of claim 13, wherein said correlating correlates the true excursion to a particular sensor of the one or more sensors.

15. The computing system of claim 13, wherein said correlating correlates the true excursion to a particular substrate processing operation in a particular tool of the one or more manufacturing tools.

16. The computing system of claim 13, wherein correlating is based on applying a combination of stochastics and machine learning algorithms to the one or more time series traces and the metrology data.

17. A non-transitory computer-readable medium comprising instructions that when executed by a computing device cause the computing device to perform a method for detecting excursions in time-series traces received from sensors of manufacturing tools, the method comprising:

extracting one or more time series traces and metrology data collected from one or more sensors associated with one or more manufacturing tools configured to produce a silicon substrate, wherein the one or more time series traces includes a time transition associated with the one or more sensors between a first semiconductor processing operation on the silicon substrate and a second semiconductor processing operation on the silicon substrate;

identifying one or more candidate excursions of the one or more time series traces by comparing the one or more time series traces to one or more traces associated with a working reference sensor;

verifying that a candidate excursion of the one or more candidate excursions is a true excursion based on correlating the one or more time series traces to the metrology data;

rank ordering the true excursion within a plurality of true excursions, and presenting the rank ordering of the plurality of true excursions and at least one sensor associated with each of the plurality of true excursions on a dashboard;

receiving a selection of a suspected sensor of the one or more sensors, associated with the true excursion; and instructing a manufacturing system to take corrective action to remove the a source of the true excursion related to the first or second semiconductor processing operations on the silicon substrate.

18. The non-transitory computer-readable medium of claim 17, wherein said correlating correlates the true excursion to a particular sensor of the one or more sensors.

19. The non-transitory computer-readable medium of claim 17, wherein said correlating correlates the true excursion to a particular substrate processing operation in a particular tool of the one or more manufacturing tools.

20. The non-transitory computer-readable medium of claim 17, wherein correlating is based on applying a combination of stochastics and machine learning algorithms to the one or more time series traces and the metrology data.

\* \* \* \* \*